US005229972A

United States Patent [19]
Kondo et al.

[11] Patent Number: 5,229,972
[45] Date of Patent: Jul. 20, 1993

[54] NONVOLATILE SEMICONDUCTOR MEMORY SYSTEM

[75] Inventors: Hitoshi Kondo; Tetsuya Yamamoto; Yukihiro Saeki, all of Yokohama, Japan

[73] Assignee: Kabushiki Kaisha Toshiba, Kawasaki, Japan

[21] Appl. No.: 639,331

[22] Filed: Jan. 10, 1991

[30] Foreign Application Priority Data

Jan. 19, 1990 [JP] Japan .................................. 2-9575

[51] Int. Cl.$^5$ .............................................. G11C 8/00
[52] U.S. Cl. ............................. 365/230.03; 365/189.02; 365/230.08
[58] Field of Search .................. 365/189.04, 189.05, 365/230.03, 230.08, 239, 240, 236; 395/400, 425; 377/24.1

[56] References Cited

U.S. PATENT DOCUMENTS

| 4,682,287 | 7/1987 | Mizuno et al. .................. 377/24.1 |
| 4,754,435 | 6/1988 | Takamatsu ...................... 365/230.03 |

FOREIGN PATENT DOCUMENTS

0067925A3 12/1982 European Pat. Off. .
0304981A2 11/1989 European Pat. Off. .
2171543A 2/1985 United Kingdom .

OTHER PUBLICATIONS

European Search Report, EP 91 10 0033.
Patent Abstracts of Japan, No. JP59016187, May 17, 1984.
Patent Abstracts of Japan, No. JP63181190, Dec. 2, 1988.

Primary Examiner—Joseph E. Clawson, Jr.
Assistant Examiner—Vu Le
Attorney, Agent, or Firm—Finnegan, Henderson, Farabow, Garrett & Dunner

[57] ABSTRACT

An EPROM integrated circuit includes a plurality of banks. When a data write operation is to be performed for this EEPROM integrated circuit, a bank which is used once is not used again, but the operation is constantly performed for new banks. In order to select a bank, a write number storage area is provided in the EPROM integrated circuit, and the contents of the write number storage area are updated by a write number updating circuit each time the write operation is performed for a new bank.

14 Claims, 6 Drawing Sheets

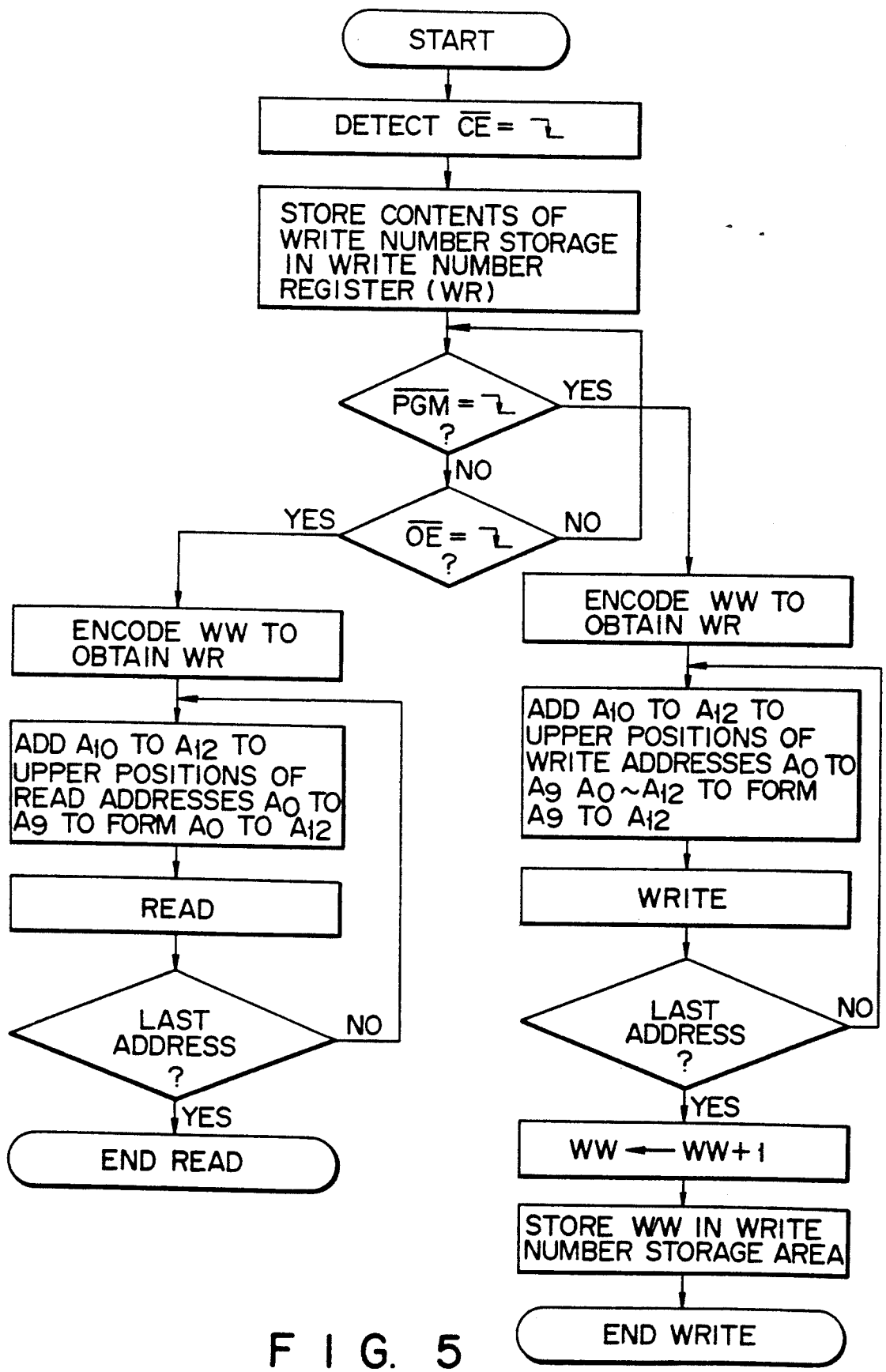
F I G. 5

NONVOLATILE SEMICONDUCTOR MEMORY SYSTEM

BACKGROUND OF THE INVENTION

1. Field of the Invention

The present invention relates to a semiconductor memory system and, more particularly, to a nonvolatile semiconductor memory system using an electrically programmable read only memory (EPROM).

2. Description of the Related Art

In a read only memory (ROM) such as a mask ROM an EPROM (erasable and programmable ROM), or an EEPROM (electrically erasable and programmable ROM), arbitrary addresses are allowed to be accessed in an arbitrary order. Since, however, a data read operation is a main or only operation, a data write (program) timing in each of the above ROMs is limited as follows. That is, the data write operation is performed during a wafer process in the mask ROM. In the EPROM, although a user can write data by an electrical means, ultraviolet radiation processing must be performed to erase previous data in order to rewrite data, or a rewrite operation cannot be performed. In the EEPROM, a user can arbitrarily perform data write/read operations by using an electrical means.

As described above, a user can electrically write data in the EPROM or EEPROM and can perform electrical write/erase operations especially in the EEPROM. For this reason, the EEPROM can be used as a static random access memory (SRAM). In addition, the EEPROM can provide a high additional value, i.e., it requires no battery backup for data storage. Since the EEPROM is expensive, however, it is unsuitable for constructing an inexpensive system.

When a data rewrite operation need not be performed during an operation of a system of interest or a data write operation need only be performed once, it is preferable to use the EPROM which is less expensive than the EEPROM. In addition, when a data write operation need only be performed once, one time PROM (OTPROM) is obtained by omitting a transparent window from a package of the EPROM and therefore a less expensive one can be used. Although a system arrangement using this OTPROM is the same as that using the EPROM, a user cannot erase data since no transparent window for ultraviolet radiation is formed in a package of an integrated circuit. Therefore, a user can perform a data write operation only once.

In order to perform a data rewrite operation in a system using the EPROM as described above, an EPROM integrated circuit is temporarily removed from a board mounting the EPROM, ultraviolet rays are radiated on an EPROM chip through a transparent window of a package of the EPROM to erase data, and a data rewrite operation is performed by using an exclusive EPROM data writer.

In a system using an EPROM as a program memory, a program need only be written once if the program is systematically completed. If, however, a function is to be added to the system by using a program or the system is incomplete, a rewrite operation must be performed several times. In addition, as another application of the EPROM, the EPROM is sometimes used as a fine adjustment data memory for machine control or a password registration memory for system security. Fine adjustment data for machine control need only be rewritten once to several times during machine assemble/adjustment steps, and a password for security need only be written upon initial password registration and rewritten several times when the password must be changed for some reasons.

When a write operation must be performed several times as described above, an EPROM having an ultraviolet radiation transparent window for data erasure in a package of an integrated circuit or an EEPROM capable of performing electrical erase/write operations is used. Since, however, a package having a transparent window or an integrated circuit chip of the EEPROM is expensive, a realized system becomes expensive too.

SUMMARY OF THE INVENTION

It is, therefore, an object of the present invention to provide a nonvolatile semiconductor memory system capable of rewriting data, even when a write operation must be performed a plurality of times for an EPROM, without temporarily removing an EPROM integrated circuit from a board mounting the EPROM integrated circuit and erasing the data by ultraviolet radiation upon each write operation.

It is another object of the present invention to provide a nonvolatile semiconductor memory system which need not use an expensive EPROM integrated circuit having an ultraviolet radiation window for data erasure in a package of an integrated circuit and therefore is very advantageous in cost and handling.

According to the present invention, there is provided a nonvolatile semiconductor memory system comprising a nonvolatile data storage means, having a plurality of data banks, for performing a data write operation in units of data banks, a wire number storage means for storing the number of data write operations with respect to the data banks of the nonvolatile data storage means, a data bank designating means for address-designating the data banks of the nonvolatile data storage means in accordance with the contents of the write number storage means, and an updating means for updating the contents of the write number storage means each time a data write operation is performed for the data banks of the nonvolatile data storage means.

BRIEF DESCRIPTION OF THE DRAWINGS

FIG. 5 is a flow chart for explaining an operation of the memory system shown in FIG. 4;

FIGS. 6A to 6F are views showing data formats of a part of data stored in the memory system shown in FIG. 4.

DETAILED DESCRIPTION OF THE PREFERRED EMBODIMENTS

Figure 1:
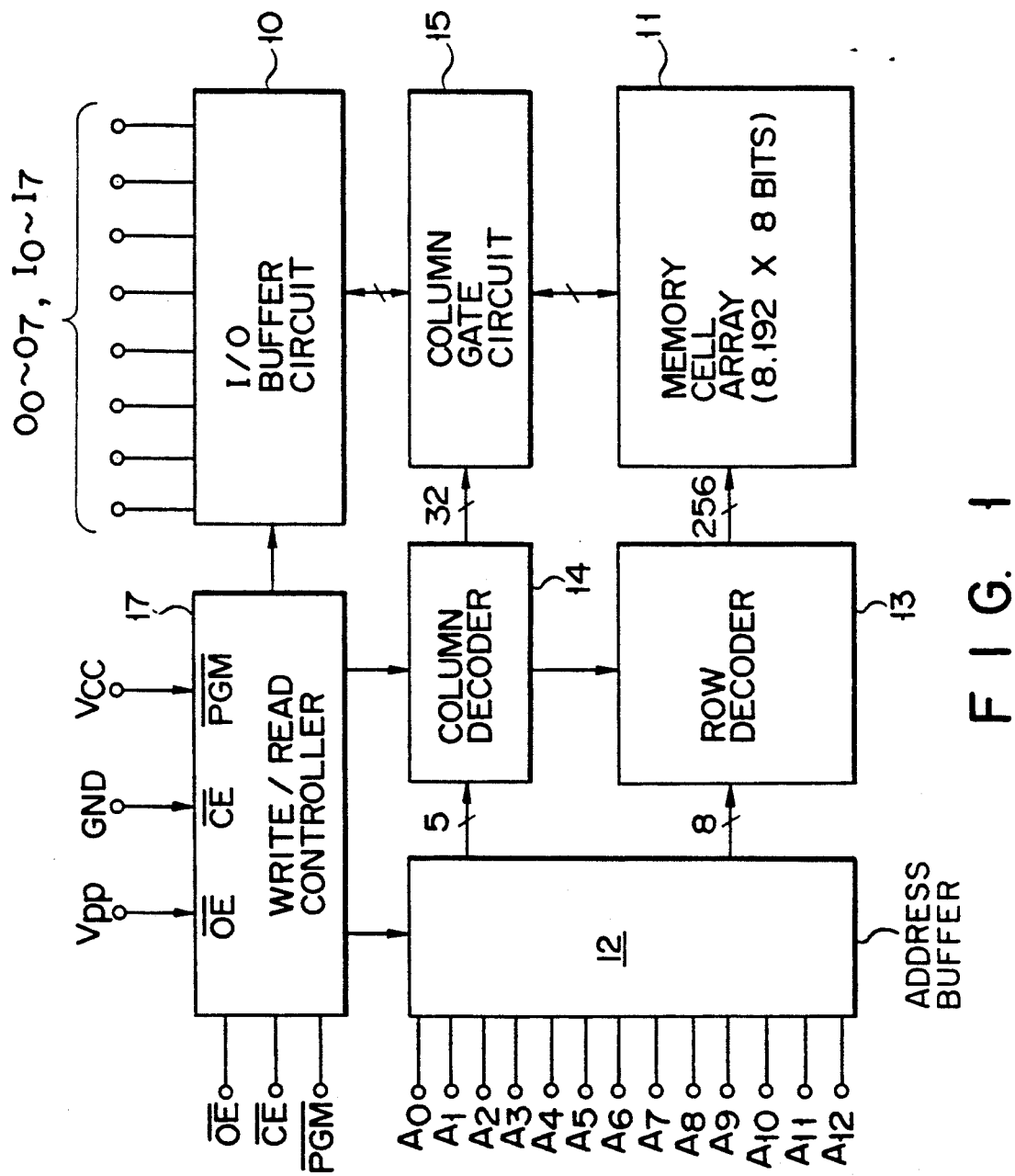
FIG. 1 is a block diagram showing an EPROM circuit used in the embodiment of the present invention.

FIG. 1 shows an arrangement of an EPROM circuit used in a nonvolatile semiconductor memory system of the present invention. A memory cell array 11 has, e.g., a storage capacity of 65,536 (64 k) bits capable of storing 8,192 (8 k) words of 8-bit data (one word). In other words, 65,536 nonvolatile memory elements are arranged in the memory cell array 11.

An address buffer 12 receives 13-bit address input signals $A_0$ to $A_{12}$, outputs the upper eight bits as row address signals to a row decoder 13, and outputs the lower five bits as column address signals to a column decoder 14.

The row decoder 13 decodes the 8-bit row address signals, and 256 row lines of the memory cell array 11 are selected on the basis of the decoded signals. The column decoder 14 decodes the 5-bit column address signals, and 32 column gates in a column gate circuit 15 connected in correspondence with 32 column lines of the memory cell array 11 are selected on the basis of the decoded signals from the column decoder 14.

An I/O buffer circuit 16 is connected to the output side of the column gate circuit 15. The I/O buffer circuit 16 has 8-bit I/O buffers.

A write/read controller 17 receives, in addition to a normal power source voltage $V_{CC}$ and a ground potential GND, a high voltage (program voltage) $V_{PP}$ for a write operation, a low-active chip enable signal $\overline{CE}$, a low-active program signal $\overline{PGM}$, and a low-active output enable signal $\overline{OE}$. The write/read controller 17 supplies required operation voltage and control signals to each section in accordance with an operation mode of the EPROM. That is, when the chip enable signal $\overline{CE}$ goes active, the address buffer 12, the row decoder 13, and the column decoder 14 are activated. In a write mode in which the program signal $\overline{PGM}$ goes active, the write voltage $V_{PP}$ is supplied to predetermined circuits. When the output enable signal $\overline{OE}$ goes active in a read mode in which the program signal $\overline{PGM}$ goes inactive, the I/O buffer circuit 16 is activated.

Figure 2:
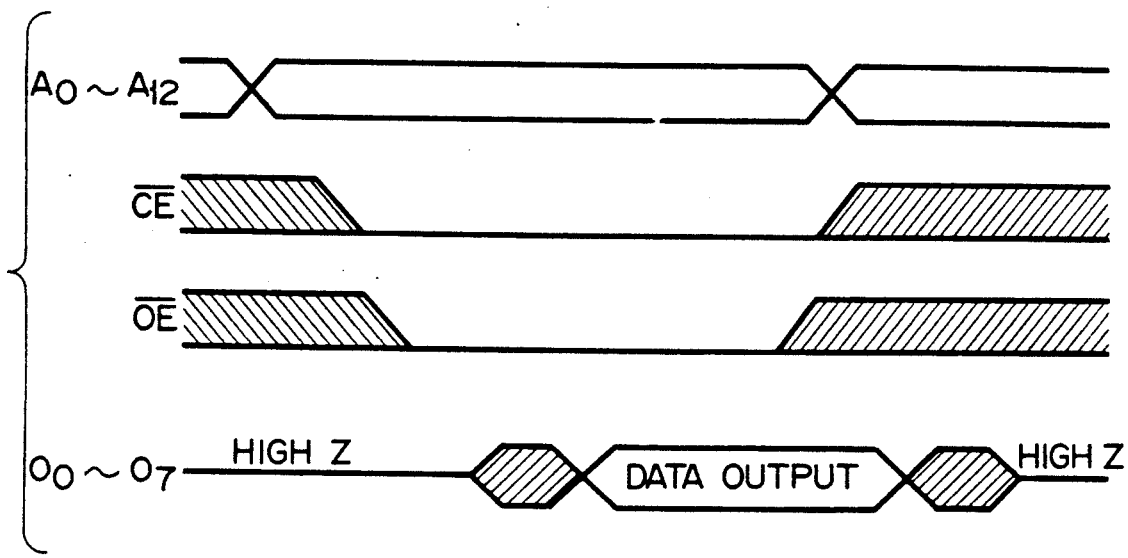
FIG. 2 is a timing chart for explaining a data read operation of the EPROM circuit shown in FIG. 1.

When a data read operation is to be performed in the EPROM circuit having the above arrangement, as shown in FIG. 2, while the chip enable signal $\overline{CE}$ and the program signal $\overline{PGM}$ are set at levels "L" and "H", respectively, a read address is determined on the basis i of the address input signals $A_0$ to $A_{12}$. Thereafter, the output enable signal $\overline{OE}$ changes from level "H" to "L", and the 8-bit output data $O_0$ to $O_7$ are read out from the memory cell array 11 via the column gate circuit 15 and the I/O buffer circuit 16.

Figure 3:
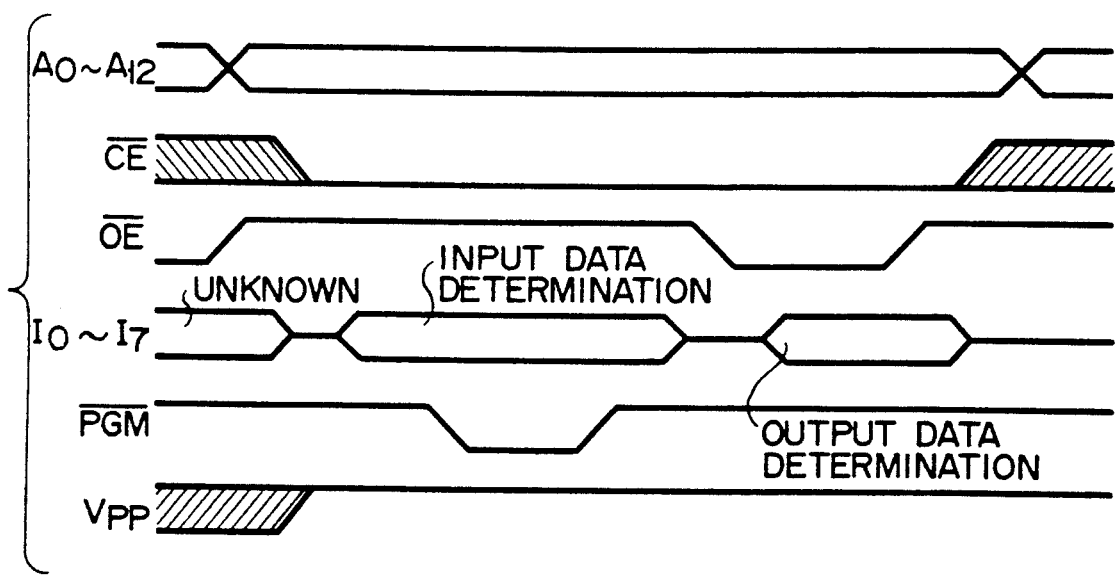
FIG. 3 is a timing chart for explaining a data write operation of the EPROM circuit shown in FIG. 1.

In a data write mode, after simultaneous data erasure is performed by ultraviolet radiation, while the chip enable signal $\overline{CE}$ and the output enable signal $\overline{OE}$ are set at levels "L" and "H", respectively, a write address is determined on the basis of the address input signals $A_0$ to $A_{12}$, as shown in FIG. 3. In this operation, after 8-bit input data $I_0$ to $I_7$ are supplied to the I/O buffer circuit 16 to determine write data, the program signal $\overline{PGM}$ is changed from level "H" to "L", and the 8-bit data is electrically written in the memory cell array 11 via the column gate circuit 15.

Figure 4:
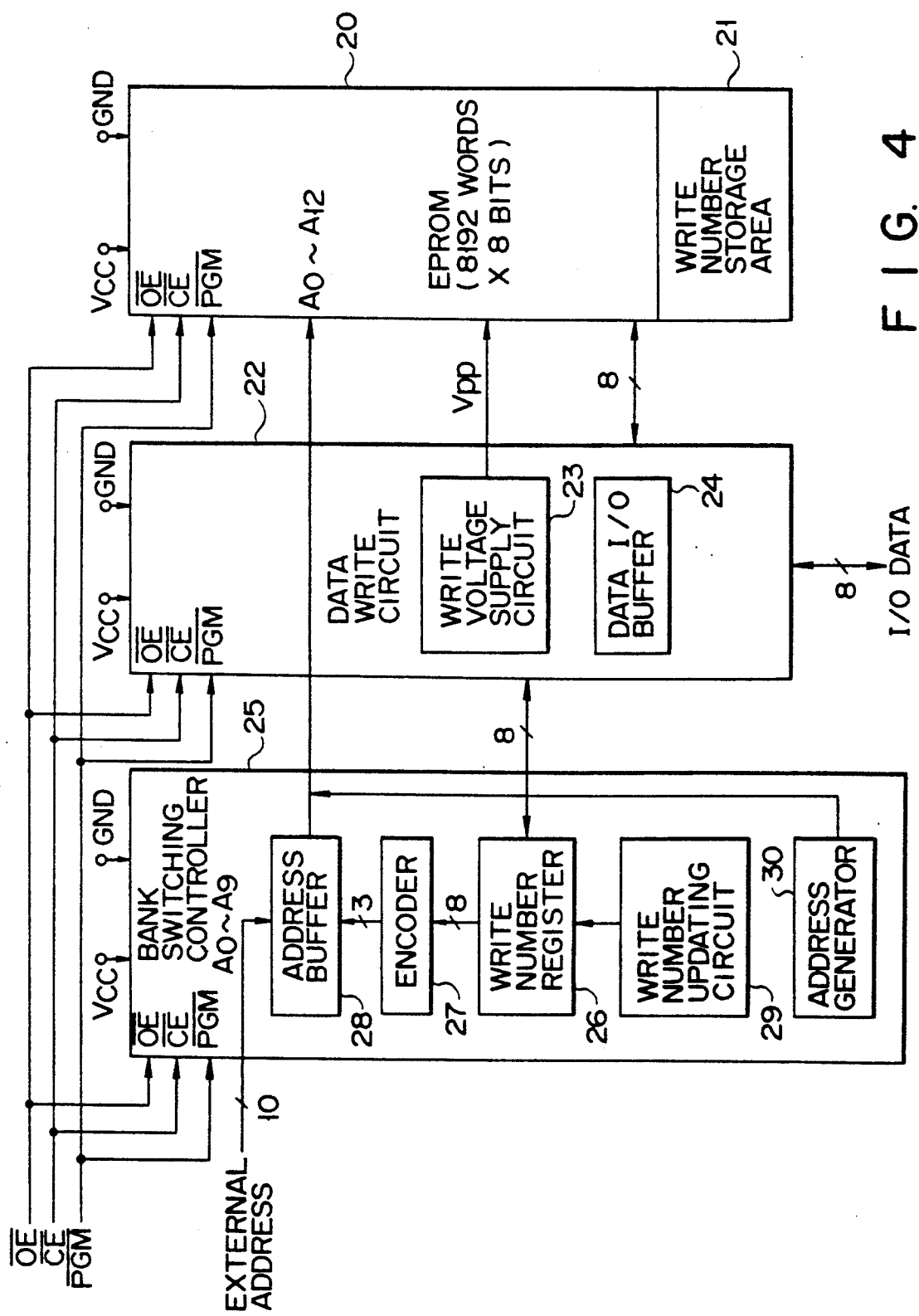
FIG. 4 is a block diagram showing an arrangement of the entire memory system of the first embodiment of the present invention using the EPROM circuit shown in FIG. 1.

FIG. 4 is a block diagram showing the entire arrangement of a nonvolatile semiconductor memory system using the EPROM circuit shown in FIG. 1.

Referring to FIG. 4, an EPROM integrated circuit 20 is obtained by integrating the EPROM circuit shown in FIG. 1 on a single chip. The EPROM integrated circuit 20 has eight banks which can be address-designated on the basis of combinations of 3-bit signals $A_{10}$, $A_{11}$, and $A_{12}$ of the 13-bit address input signals A0 to A12. When the storage capacity is 65,536 bits as described above, therefore, a storage capacity of one bank is 1,024 (1 k) words. In the embodiment, however, seven out of the eight banks are used in data write and read operations.

When each of the 3-bit address signals $A_{10}$, $A_{11}$, and $A_{12}$ is at, e.g., level "1", a specific one word in a corresponding bank, e.g., one word as the last address is kept as a write number storage area 21 for storing data corresponding to the number of data write operations performed for the EPROM integrated circuit 20. As will be described below, data of level "1" is sequentially written in the write number storage area 21 from the lower bit side of one word each time a write operation is performed for one bank. Note that a so-called OTPROM having no transparent window for ultraviolet radiation for data erasure in its package used as the EPROM integrated circuit 20. This OTPROM is available at low price since it has no ultraviolet radiation transparent window.

As described above, the EPROM integrated circuit 20 receives, in addition to the normal power source voltage $V_{CC}$ and the ground potential GND, the high voltage $V_{PP}$ for a write operation, the low-active chip enable signal $\overline{CE}$, the low-active program signal $\overline{PGM}$, the low-active output enable signal $\overline{OE}$, and the 13-bit address signals $A_0$ to $A_{12}$. Note that address signals externally supplied to the memory system shown in FIG. 4 in a normal data write or read mode are only 10-bit address signals $A_0$ to $A_9$ required to designate 1,024 (1 k) words of one bank. The upper 3-bit address signals $A_{10}$, $A_{11}$, and $A_{12}$ are generated in the system as will be described later.

A data write circuit 22 includes a write voltage supply circuit 23 and a data I/O buffer 24. When the program signal $\overline{PGM}$ goes active, the write voltage supply circuit 23 boosts the value of the power source voltage $V_{CC}$ to generate the high voltage $V_{PP}$ for a write operation and supplies the high voltage $V_{PP}$ to the EPROM integrated circuit 20. The data I/O buffer 24 transmits 8-bit data. Note that the two circuits described above are integrated in one chip in this data write circuit 22.

A bank switching controller 25 has a function of controlling switching between banks for performing write/read operations for the EPROM integrated circuit 20 in accordance with the number of program (data) write operations performed for the circuit 20. That is, in a data write mode in which the program signal $\overline{PGM}$ goes active after the chip enable signal $\overline{CE}$ goes active, address designation is performed for unwritten banks of the EPROM integrated circuit 20 in accordance with the contents of the write number storage area 21 of the circuit 20, and the contents of the area 21 are updated after a data write operation is performed for the banks. In a data read operation in which the output enable signal $\overline{OE}$ goes active after the chip enable signal $\overline{CE}$ goes active, address designation is performed for the banks in the EEPROM integrated circuit 20 in accordance with the contents of the write number storage area 21.

More specifically, the bank switching controller 25 is constituted by a write number register 26, an encoder 27, an address buffer 28, a write number updating circuit 29, and an address generator 30.

The write number register 26 holds 8-bit storage contents read out from the write number storage area 21 and supplied via the data I/O buffer 24 of the data write circuit 22. The encoder 27 converts the 8-bit contents in the write number register 26 into 3-bit binary codes. The address buffer 28 adds the 3-bit signals output from the encoder 27 as the address signals $A_{10}$, $A_{11}$, and $A_{12}$ to the upper positions of the 10-bit external address input signals $A_0$ to $A_9$ supplied to the system and supplies the obtained signals to the EPROM integrated circuit 20. In a data write mode, the write number updating circuit 29 updates the contents of the write number register 26 after a data write operation for the EPROM integrated circuit 2 is completed. The updated data is stored again in the write number storage area 21 via the data I/O buffer 24 in the data write circuit 22.

The address generator 30 generates address signals $A_0$ to $A_{12}$ of the EPROM integrated circuit 20 required when the contents of the write number storage area 21 are read out or the data in the write number register 26 having the updated contents is stored again in the write number storage area 21. Note that all of the above circuits are integrated on one chip as in the case of the data write circuit 22 described above.

Operations of the memory system of this embodiment will be described below with reference to FIGS. 5 and 6A to 6F.

In an initial state of this system, ultraviolet rays are radiated on a semiconductor chip included in the EPROM integrated circuit 20 in the manufacture of the circuit to erase all of data (e.g., data "0"). In the initial state, therefore, the stored contents of the write number storage area 21 of the EPROM integrated circuit 20 are "00000000".

A program write or read operation is started when the chip enable signal $\overline{CE}$ goes active (falls to level "0"). Thereafter, the stored contents in the write number storage area 21 are read out and stored in the write number register 26 of the bank switching controller 25 via the data I/O buffer 24.

Subsequently, it is detected that the program signal $\overline{PGM}$ and the output enable signal $\overline{OE}$ are activated (fall to level "0"). When the program signal $\overline{PGM}$ is activated, i.e., when a write mode is set, one bank of the EPROM integrated circuit 20 is selected to perform the data write operation.

The data write operation is performed as follows. First, the 8-bit data stored in the write number register 26 is encoded into 3-bit signals by the encoder 27. Assume that the 3-bit signals encoded by the encoder 27 are WR and the 8-bit data before encoding is WW. The address buffer 28 adds the 3-bit signals WR as $A_{10}$, $A_{11}$, and $A_{12}$ to the upper positions of the externally input 10-bit address signals $A_0$ to $A_9$ for a write operation and supplies the obtained signals to the EPROM integrated circuit 20. Since 8-bit write data is supplied to the EPROM integrated circuit 20 via the data I/O buffer 24 in the data write circuit 22, this data is written in a specific bank of the EPROM integrated circuit 20 address-designated by the 13-bit address signal. For example, in the first write operation, the stored contents in the write number storage area 21 are "00000000" as shown in FIG. 6A. After the contents of the area 21 are stored in the write number register 26, the contents of the write number register 26 are encoded by the encoder 27, and the 3-bit signals $A_{10}$, $A_{11}$, and $A_{12}$ are obtained as "000". Thereafter, since the 3-bit outputs $A_{10}$, $A_{11}$, and $A_{12}$ "000" from the encoder 27 are added to the upper positions of the externally input addresses $A_0$ to $A_9$, a data write operation for one bank in the EPROM integrated circuit 20 in which $A_{10}$, $A_{11}$, and $A_{12}$ correspond to "000" is started. This data write operation is performed within the range of 1,024 words from addresses (0000H) to (03FFH) in hexadecimal notation. When the last address of the data write operation for the above bank is detected, the write number updating circuit 29 changes the level of the least significant bit of bits having level "0" in the write number register 26 to level "1" ($WW \leftarrow WW+1$). Thereafter, the contents of the write number updating circuit 29 are supplied to the EPROM integrated circuit 20 via the data I/O buffer 24. Meanwhile, the address generator 30 generates an address signal for address-designating the write number storage area 21 and supplies the signal to the EPROM integrated circuit 20. As a result, a rewrite operation is performed for the write number storage area 21, and a series of write operations are completed. That is, the stored contents in the write number storage area 21 obtained when the first data write operation is completed are changed to "00000001" as shown in FIG. 6B.

After the chip enable signal $\overline{CE}$ goes active, if not the program signal $\overline{PGM}$ but the output enable signal $\overline{OE}$ goes active, a read mode is set. In this case, one bank of the EPROM integrated circuit 20 is selected to perform a data read operation. First, the 8-bit data stored in the write number register 26 is encoded by the encoder 27 into 3-bit signals. Subsequently, the buffer 28 adds the 3-bit signals WR as $A_{10}$, $A_{11}$, and $A_{12}$ to the upper positions of the externally input 10-bit address signals $A_0$ to $A_9$ for a write operation and supplies the obtained signals to the EPROM integrated circuit 20. In this case, the stored contents in the write number storage area 21 obtained after the first write operation is performed are "00000001". After the contents of the area 21 are stored in the write number register 26, the contents of the register 26 are encoded by the encoder 27. In this case, unlike in the write operation, the 3-bit signals $A_{10}$, $A_{11}$, $A_{12}$ are obtained as "000". Note that the encoder 27 is arranged to provide different outputs in the data write and read modes.

Thereafter, since the 3-bit outputs $A_{10}$, $A_{11}$, and $A_{12}$ "000" from the encoder 27 are added to the upper positions of the externally input addresses $A_0$ to $A_9$, a data read operation is started for one bank of the EPROM integrated circuit 20 in which $A_{10}$, $A_{11}$ and $A_{12}$ correspond to "000". When the last address of the data read operation for the above bank is detected, the read operation is completed.

In the second write operation, the data "00000001" read out from the write number storage area 21 when the operation is started is stored in the write number register 26. Since the 3-bit outputs $A_{10}$, $A_{11}$, and $A_{12}$ "001" from the encoder 27 are added to the upper positions of the read address signals $A_0$ to $A_9$ supplied to the system, a data write operation is performed within the range of 1,024 words from addresses (0400H) to (07FFH) in hexadecimal notation. After the second data write operation is performed, the number of data in a write state of the eight bits of the write number register 26 is increased by one, and the state of data write number storage area 21 is updated to "00000011" as shown in FIG. 6C from then on. In addition, when a read operation is to be performed after the second data write operation is performed, since the read addresses are supplied to the EPROM integrated circuit 20 within the range of (0400H) to (07FFH) as described above, an area corresponding to the addresses (0000H) to (03FFH) subjected to the first write operation is not accessed.

Similarly, the third write operation is performed within the range of 1,024 words from addresses (0800H)

to (0BFFH). In this manner, the data write/read operations can be performed up to seven times while the banks are switched. FIGS. 6D, 6E, and 6F show data formats in the write number storage area 21 obtained after the third, fourth, and seventh write operations are completed, respectively.

In the above embodiment, the number of write operation times are stored in the write number storage area 21 set in the EPROM integrated circuit 20. The number of write operation times, however, may be stored in a nonvolatile storage element (e.g., an EPROM element or a polysilicon fuse to be fused by a current) formed independently of the EPROM integrated circuit 20.

Figure 7:
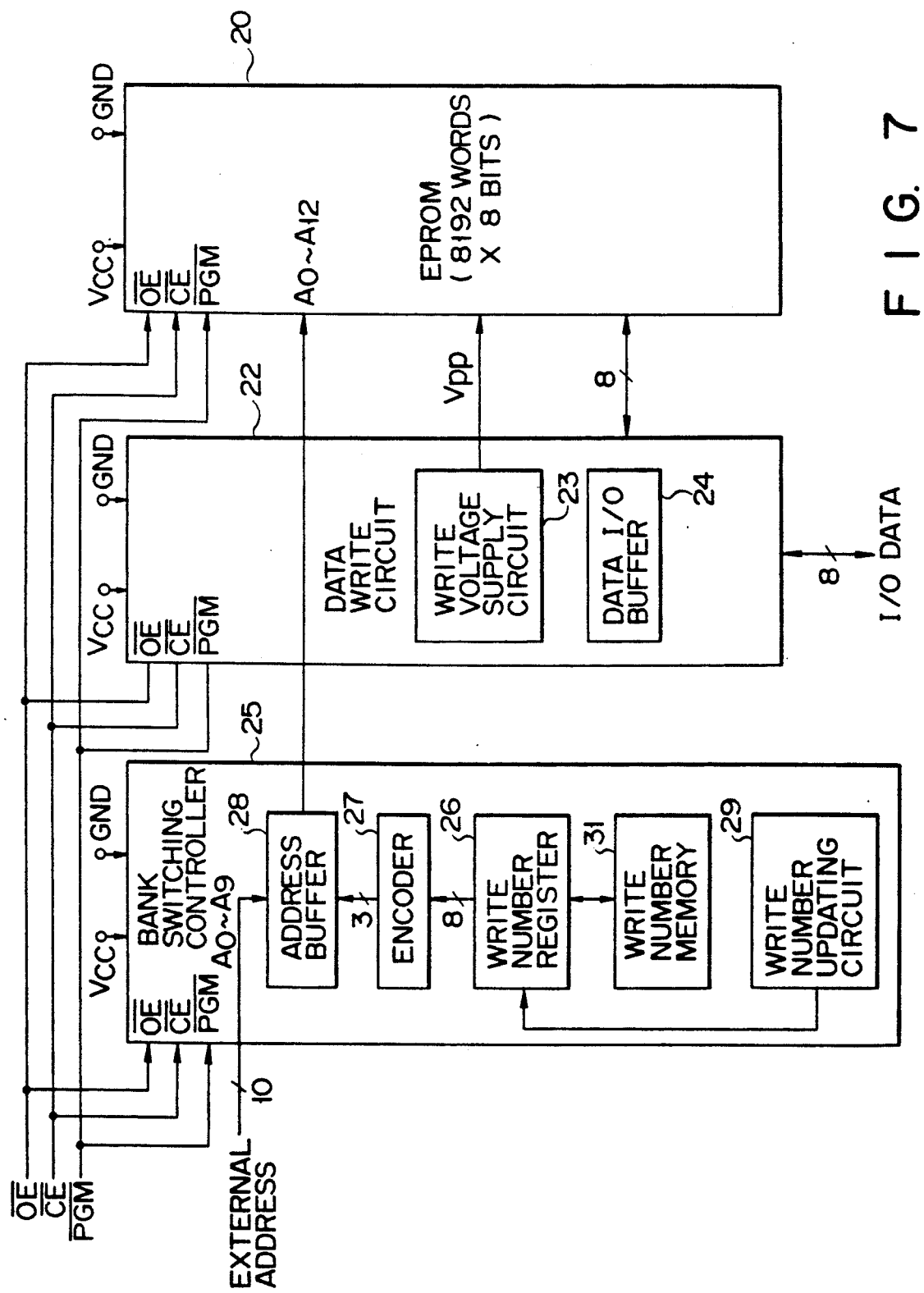
FIG. 7 is a block diagram showing an arrangement of the entire memory system of the second embodiment of the present invention.

FIG. 7 shows an arrangement according to the second embodiment of the present invention. In a memory system of this embodiment, no write number storage area 21 is set in an EPROM integrated circuit 20, but a write number memory 31 having a storage capacity of at least eight bits is provided in a bank switching controller 25 to store data corresponding to the number of write operation times. In this embodiment, therefore, the address generator 30 need not be used, and all of the eight banks in the EPROM integrated circuit 20 can be used in (program) data write and read operations.

In the embodiment shown in FIG. 4, the data write circuit 22 and the bank switching controller 25 are arranged as an integrated circuit independent from the EPROM integrated circuit 20. The present invention, however, includes an arrangement in which all the circuits are formed in a single integrated circuit.

According to the present invention as described above, even when a write operation must be performed for an EPROM a plurality of times, data can be rewritten without temporarily removing an EPROM integrated circuit from an EPROM mounting board to erase the data by ultraviolet radiation each time the write operation is to be performed. In addition, since an expensive EPROM having an ultraviolet radiation transparent window for data erasure in a package of an integrated circuit need not be used, a semiconductor memory system which is very advantageous in manufacturing cost and handling properties can be realized.

What is claimed is:

1. A nonvolatile semiconductor memory system comprising:
   nonvolatile data storage means, having a plurality of data banks, for performing a data write operation in units of data banks;
   write number storage means for storing the number of data write operation times with respect to said data banks of said nonvolatile data storage means;
   data bank designating means for performing address designation for said data banks in said nonvolatile data storage means in accordance with the contents of said write number storage means; and
   updating means for updating the contents of said write number storage means each time a data write operation for each data bank of said nonvolatile data storage means is completed.

2. A system according to claim 1, wherein said write number storage means is provided in said non-volatile data storage means.

3. A system according to claim 1, wherein said write number storage means has data storage areas of a plurality of bits.

4. A system according to claim 3, wherein said updating means updates the contents of said write number storage means by sequentially writing data in different data storage areas of said write number storage means.

5. A system according to claim 4, wherein said data bank designating means comprises:
   a register for holding the contents of said write number storage means;
   an encoder for converting the contents held by said register into binary data; and
   an address buffer for receiving an externally input address and an output from said encoder, adding the output from said encoder to the externally input address, and outputting the addition result as an address to said nonvolatile data storage means.

6. A system according to claim 1, wherein said nonvolatile data storage means is constituted by an EPROM (Electrically Programmable Read Only Memory) integrated circuit.

7. A system according to claim 6, wherein said EPROM integrated circuit is a one time PROM (OTPROM) integrated circuit.

8. A system according to claim 1, wherein said nonvolatile data storage means, said write number storage means, said data bank designating means, and said updating means are formed on a single integrated circuit chip.

9. A system according to claim 6, wherein said write number storage means is constituted by an EPROM circuit formed in an integrated circuit independent from said EPROM integrated circuit.

10. A nonvolatile semiconductor memory system comprising:
    an EPROM (Electrically Programmable Read Only Memory) integrated circuit, having a plurality of data banks, for performing a data write operation in units of data banks;
    a write number storage area, provided on said EPROM integrated circuit, for storing the number of data write operation times with respect to said data banks;
    data bank designating means for performing address designation for said data banks of said EPROM integrated circuit in accordance with the stored contents in said write number storage area;
    updating means for updating the contents of the write number storage area each time the data write operation for each data bank of said EPROM integrated circuit is completed; and
    a data write circuit for performing the data write operation for a data bank of said EPROM integrated circuit address-designated by said data bank designating means.

11. A system according to claim 10, wherein said data write circuit includes a write voltage supply circuit for receiving an external power source voltage, boosting the received power source voltage, and supplying the boosted voltage to said EPROM integrated circuit.

12. A system according to claim 10, wherein said write number storage area has data storage areas of a plurality of bits.

13. A system according to claim 10, wherein said updating means updates the contents of said write number storage area by sequentially writing data in different bit positions of said write number storage area.

14. A system according to claim 10, wherein said data bank designating comprises:
    a register for holding the contents of said write number storage area;
    an encoder for converting the contents held by said register into binary data; and
    an address buffer for receiving an externally input address and an output from said encoder, adding the output from said encoder to the externally input address, and outputting the addition result as an address to said nonvolatile data storage means.

* * * * *